(12) United States Patent
Hsu et al.

(10) Patent No.: US 9,244,541 B2
(45) Date of Patent: Jan. 26, 2016

(54) IMAGE SENSING APPARATUS AND OPTICAL NAVIGATING APPARATUS WITH THE IMAGE SENSING APPARATUS

(71) Applicant: PixArt Imaging Inc., Hsin-Chu (TW)

(72) Inventors: En-Feng Hsu, Hsin-Chu (TW);
Ching-Wei Chen, Hsin-Chu (TW);
Chien-Sheng Chen, Hsin-Chu (TW);
Shuen-Yin Bai, Hsin-Chu (TW);
Chien-Jung Chou, Hsin-Chu (TW)

(73) Assignee: PixArt Imaging Inc., Science-Based Industrial Park, Hsin-Chu (TW)

( * ) Notice: Subject to any disclaimer, the term of this patent is extended or adjusted under 35 U.S.C. 154(b) by 0 days.

(21) Appl. No.: 14/301,314

(22) Filed: Jun. 10, 2014

(65) Prior Publication Data

US 2015/0103009 A1    Apr. 16, 2015

(30) Foreign Application Priority Data

Oct. 14, 2013   (TW) .............................. 102136986 A

(51) Int. Cl.
*G06F 3/0354* (2013.01)
*H01L 27/146* (2006.01)
*H04N 5/359* (2011.01)

(52) U.S. Cl.
CPC ....... *G06F 3/03543* (2013.01); *H01L 27/14643* (2013.01); *H04N 5/359* (2013.01)

(58) Field of Classification Search
CPC ......... G02F 1/141; G02F 1/15; G09G 3/3629; G09G 3/364; G09G 5/10; G09G 5/026; G09G 2300/0426; H01L 33/0079; H01L 27/1214; H01L 51/56; H01L 27/3244; H01L 33/22; H01L 33/58
See application file for complete search history.

(56) References Cited

U.S. PATENT DOCUMENTS

| | | | | |
|---|---|---|---|---|
| 5,907,152 A * | 5/1999 | Dandliker | ............. | G06F 3/0317 250/208.2 |
| 6,180,969 B1 * | 1/2001 | Yang | .................. | H01L 27/1443 257/291 |
| 6,452,633 B1 * | 9/2002 | Merrill | ................... | H04N 5/353 257/223 |
| 6,532,040 B1 * | 3/2003 | Kozlowski | ............. | H03F 3/087 250/208.1 |
| 6,535,247 B1 * | 3/2003 | Kozlowski | ........... | H04N 5/3745 348/241 |
| 6,833,871 B1 * | 12/2004 | Merrill | ................... | H04N 5/353 257/223 |
| 7,663,683 B2 * | 2/2010 | Miyatake | .......... | H01L 27/14609 348/300 |
| 7,923,673 B2 * | 4/2011 | Buttgen | ............ | H01L 27/14812 250/208.1 |
| 8,279,328 B2 * | 10/2012 | Lahav | .................... | H04N 5/335 348/222.1 |
| 8,284,286 B2 * | 10/2012 | Mabuchi | ................ | H04N 3/155 250/208.1 |
| 8,541,727 B1 * | 9/2013 | Xu | ............................ | G01J 1/18 250/205 |
| 8,558,163 B2 * | 10/2013 | Zarem | ................... | G06F 3/0317 250/221 |
| 8,643,756 B2 * | 2/2014 | Miyatake | ............... | H04N 3/155 348/308 |
| 8,872,093 B2 * | 10/2014 | Lee | .......... | G09G 3/20 250/208.1 |
| 2002/0024605 A1 * | 2/2002 | Merrill | ................... | H04N 5/353 348/296 |

(Continued)

*Primary Examiner* — Temesgh Ghebretinsae
*Assistant Examiner* — Michael J Jansen, II
(74) *Attorney, Agent, or Firm* — Winston Hsu; Scott Margo

(57) ABSTRACT

An image sensing apparatus comprises at least one sensing pixel and a control circuit. The sensing pixel comprises: a charge storing device; a light sensing device, for respectively generating photoelectrons with a first, second amount in a first, second mode; and a switch device, for determining an amount that the photoelectron can be transmitted to the charge storing device according to a control voltage. The control voltage generates the control voltage to control the amount that the photoelectrons can be transmitted to the charge storing device to be a first charge amount in a first mode and to be a second charge amount in a second mode. The first, second charge amounts are smaller than a maximum charge storing amount for the charge storing device.

14 Claims, 8 Drawing Sheets

(56) References Cited

U.S. PATENT DOCUMENTS

2009/0212197 A1* 8/2009 Buttgen ............ H01L 27/14812 250/208.1

2010/0271517 A1* 10/2010 De Wit ................... H04N 5/378 348/294

2011/0013064 A1* 1/2011 Lahav .................... H04N 5/335 348/296

* cited by examiner

IMAGE SENSING APPARATUS AND OPTICAL NAVIGATING APPARATUS WITH THE IMAGE SENSING APPARATUS

BACKGROUND OF THE INVENTION

1. Field of the Invention

The present invention relates to an image sensing apparatus and an optical navigating apparatus utilizing the image sensing apparatus, and particularly relates to an image sensing apparatus that can avoid overexposure and an optical navigating apparatus with the image sensing apparatus.

2. Description of the Prior Art

A conventional optical navigating apparatus such as an optical mouse or an optical touch control apparatus always generates light to illuminate an object (ex. a finger, a touch control pen, or a surface that an optical navigating apparatus is put on), and then a plurality of frames comprising the object image is captured by an image sensing apparatus to compute location for the object. In order to avoid wrong determining due to the disturbance of environment light, many techniques are developed. One of them is capturing a frame in the period that the light source is turned off, capturing another frame in the period that the light source is turned on, and subtracting these frames to acquire a frame only with the light from the light source, to increase the accuracy for determining object location. The image sensing apparatus comprises a plurality of sensing pixels to generate sensing signals according to sensed light. Above-mentioned frames are generated via processing these sensing signals. FIG. 1 is a circuit diagram illustrating part of the pixel structure for prior art. As shown in FIG. 1, the sensing pixel 100 comprises a light sensing device PD (ex. a photo diode) and a charge storing device (ex. a capacitor). The light sensing device PD generates charges according to received light and stores the charges into the charge storing device C.

FIG. 2 is a schematic diagram illustrating how the charge storing device stores photoelectrons if the light source is turned on and if the light source is turned off, for prior art. As shown in FIG. 2, if the light source LS in FIG. 1 is turned off, the light sensing device PD generates an amount $CR_e$ of photoelectrons according to the environment light (the white circles), these photoelectrons are transmitted to the charge storing device and stored. If the light source LS in FIG. 2 is turned on, the light sensing device PD generates an amount $CR_e + CR_L$ of photoelectrons (black circles mean the photoelectrons generated by the light source light) according to environment light and light source LS. Theses photoelectrons are transmitted to the charge storing device C and stored as well. The photoelectrons generated in the period that the light source is turned on and in the period that the light source is turned off are respectively read out. The image sensing signals are generated accordingly, and then the frames are accordingly generated. By this way, the frame with only the light source light is acquired.

However, if the environment light is too bright, the accuracy for above-mentioned steps may be affected. FIG. 3 is a schematic diagram illustrating the case that the environment light is too bright such that the amount for photoelectrons is larger than the maximum charge storing amount for the charge storing device (i.e. over exposure). As shown in FIG. 3, if the environment light is too bright, the amount for photoelectrons generated by the light sensing PD according to environment light (the white circles) may exceed the maximum charge storing amount for the charge storing device. Or, in another case, the amount for photoelectrons generated by the light sensing PD according to environment light is less than the maximum charge storing amount for the charge storing device, but the sum for the photoelectrons generated by the environment light and the photoelectrons generated the light source light exceeds the maximum charge storing amount for the charge storing device. Either of these situations may cause the inaccuracy for acquiring the frame with only light source light.

SUMMARY OF THE INVENTION

Therefore, one objective of the present invention is to provide an image sensing apparatus, which can avoid the over exposure issue for the prior art.

Another objective of the present invention is to provide an optical navigating apparatus, which can compute movement for the objective based on none over-exposed frames.

One embodiment of the present invention discloses an image sensing apparatus comprising at least one sensing image and a control circuit. The sensing pixel comprises: a charge storing device; a light sensing device, for generating a first amount of photoelectrons according to received light in a first mode, and for generating a second amount of photoelectrons for according to received light in a second mode, wherein the second amount is larger than the first amount; and a switch device, for determining a charge amount that the photoelectrons can be transmitted from the light sensing device to the charge storing device according to a control voltage. The control circuit generates the control voltage, thereby the charge amount that the photoelectrons can be transmitted from the light sensing device to the charge storing device in the first mode is a first charge amount and the charge amount that the photoelectrons can be transmitted from the light sensing device to the charge storing device in the second mode is a second charge amount. The first charge amount equals to the first amount minus a third charge amount, and the second charge amount equals to the second amount minus the third charge amount.

Another embodiment of the present invention discloses: an optical navigating apparatus, comprising an image sensing apparatus, a light source and a processing unit. The image sensing apparatus generates a first image sensing signal in a first mode, and generates a second image sensing signal in a second mode, and comprises a sensing pixel and a control circuit. The sensing pixel, comprises: a charge storing device; a light sensing device, for generating a first amount of photoelectrons according to received light in a first mode, and for generating a second amount of photoelectrons according to received light in a second mode, wherein the second amount is larger than the first amount; and a switch device, for determining a charge amount that the photoelectrons can be transmitted from the light sensing device to the charge storing device according to a control voltage; and an image sensing signal generating circuit, for generating an image sensing signal according to the charges stored in the charge storing device. The control circuit generates the control voltage, thereby the charge amount that the photoelectrons can be transmitted from the light sensing device to the charge storing device in the first mode is a first charge amount and the charge amount that the photoelectrons can be transmitted from the light sensing device to the charge storing device in the second mode is a second charge amount. The first charge amount equals to the first amount minus a third charge amount, and the second charge amount equals to the second amount minus the third charge amount. The first charge amount and the second charge amount are smaller than a maximum charge storing amount for the charge storing device. The image sensing signal generating circuit generates the first image sensing signal according to the first amount of photoelectrons, and generates the second image sensing signal according to the second amount of photoelectrons. The light source generates no light in the first mode, and provides light to the light sensing device in the second mode. The processing unit subtracts the first image sensing signal from the second image sensing signal to compute movement between the optical navigating apparatus and an object. The control circuit can be integrated to the processing unit.

In view of above-mentioned embodiments, the over-exposure issue due to too bright environment light for prior art can be avoided. Additionally, the feedback mechanism and the mechanism for setting the control voltage can control the conductive level for the sensing pixel to be optimized.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
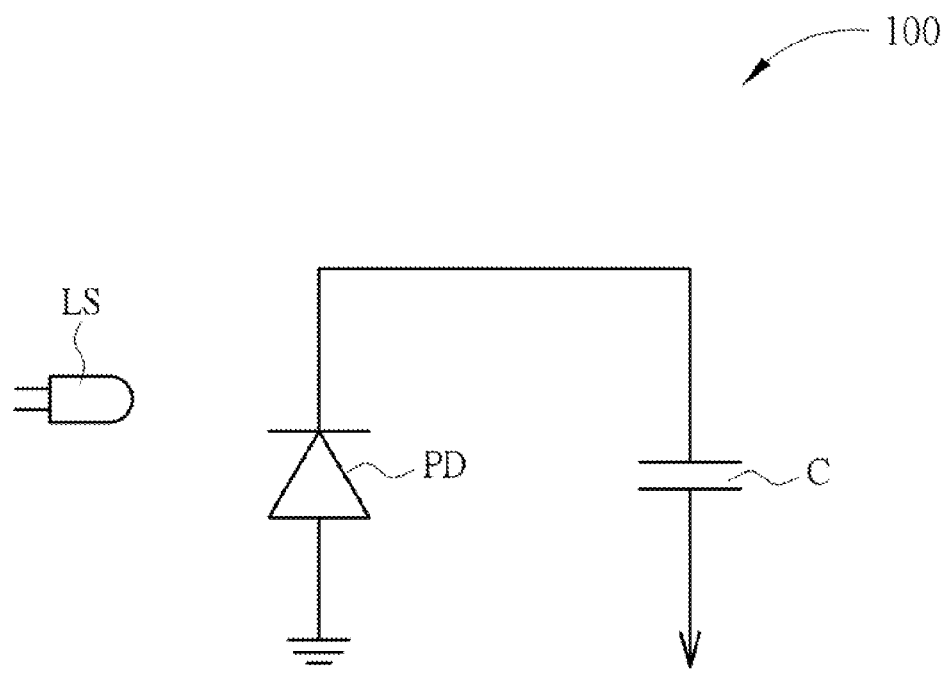
FIG. 1 is a circuit diagram illustrating part of the pixel structure for prior art.
Figure 2:
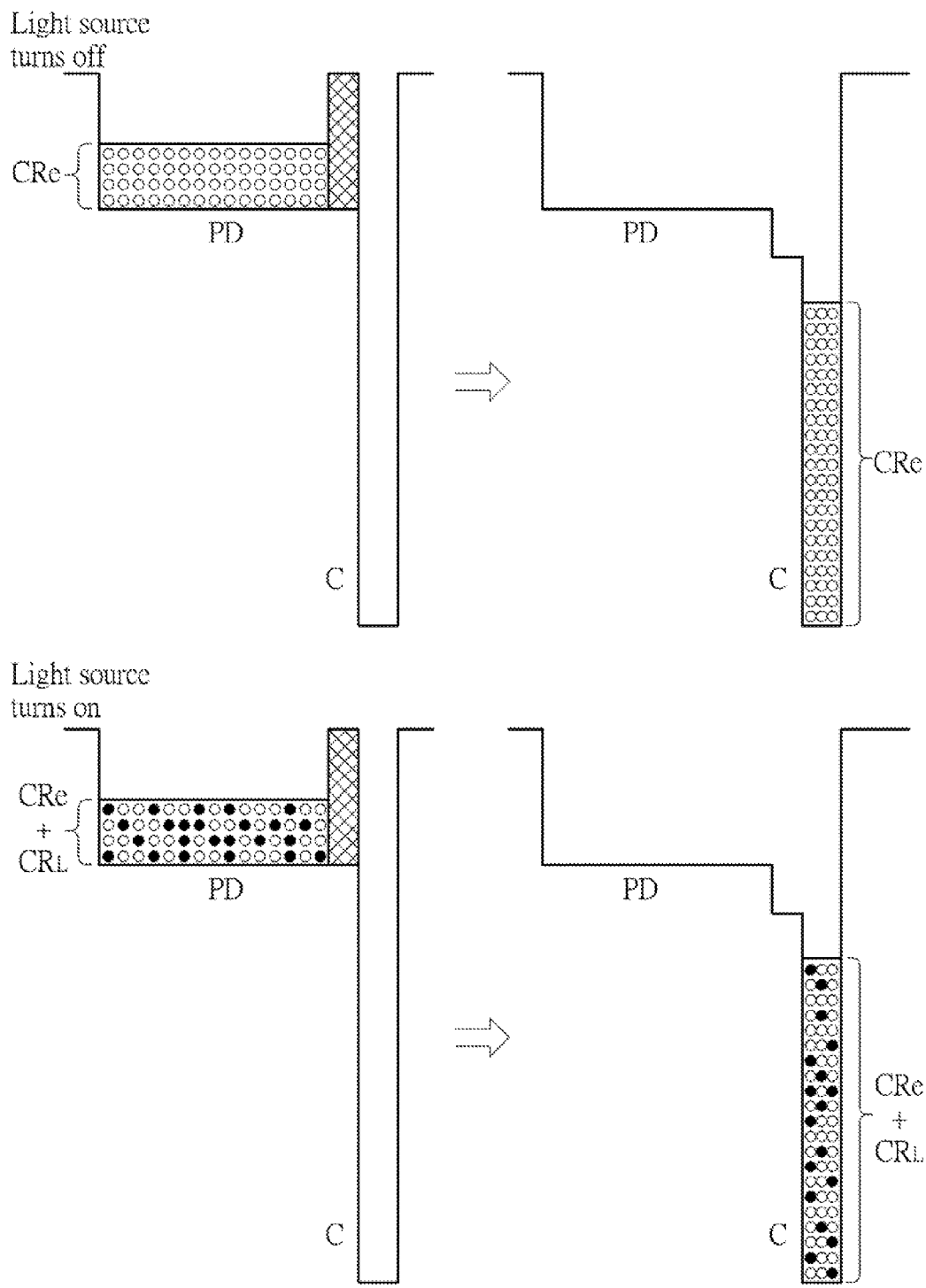
FIG. 2 is a schematic diagram illustrating how the charge storing device stores photoelectrons if the light source is turned on and if the light source is turned off, for prior art.
Figure 3:
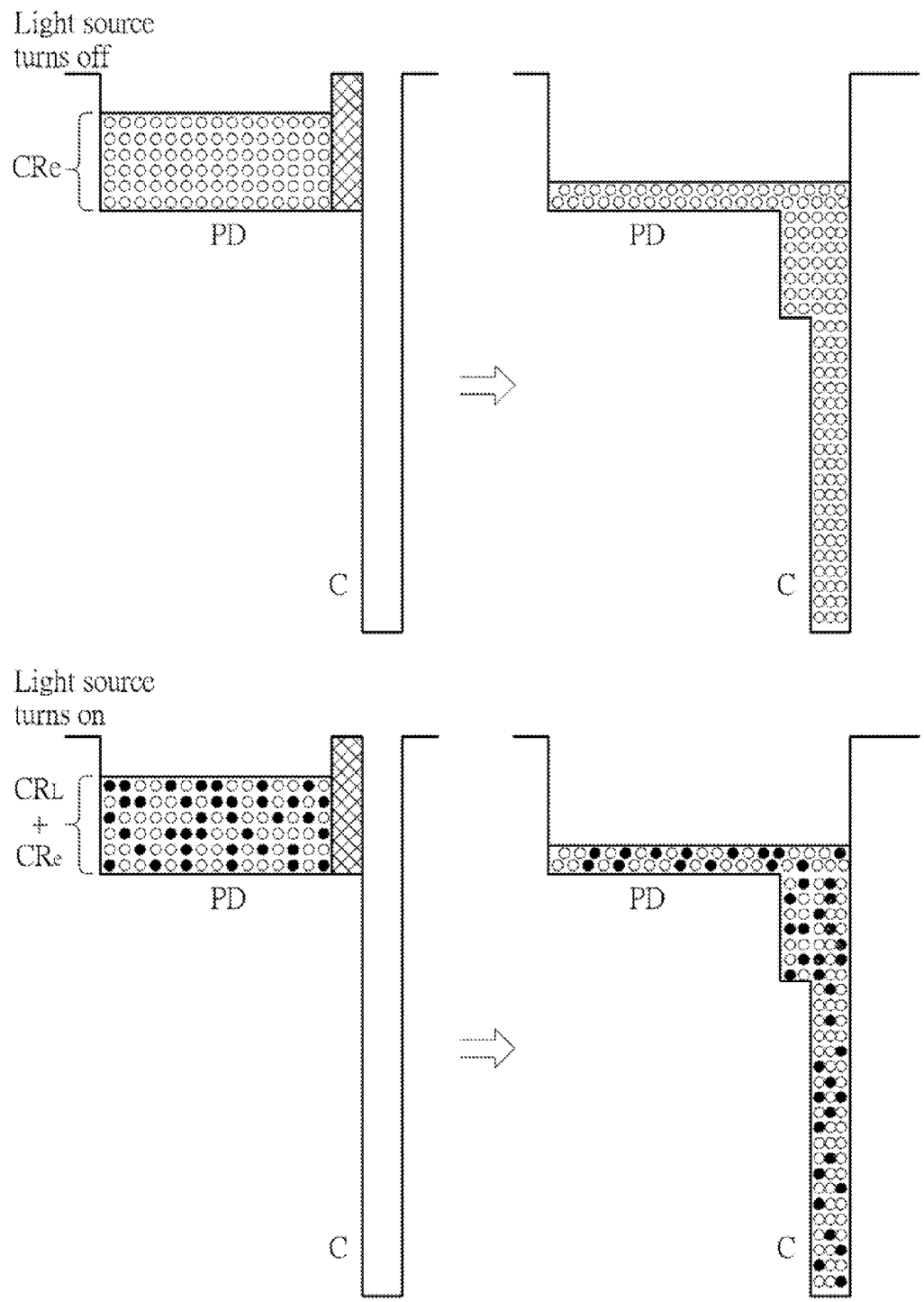
FIG. 3 is a schematic diagram illustrating the case that the environment light is too bright such that the amount for photoelectrons is larger than the maximum amount for the charges that the charge storing device can store.
Figure 4:
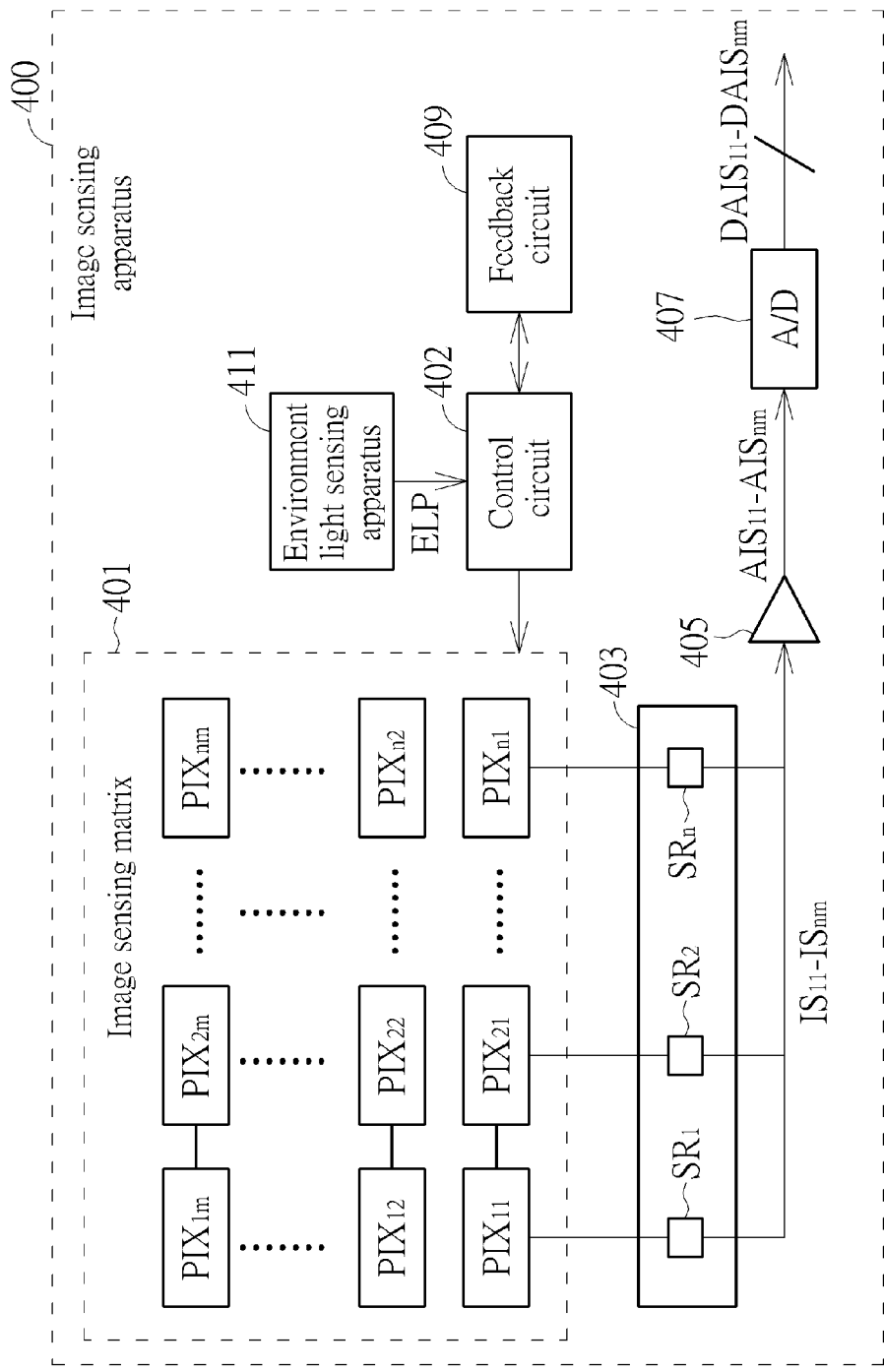
FIG. 4 and FIG. 5 are circuit diagrams illustrating an image sensing apparatus according to one embodiment of the present invention.
Figure 5:
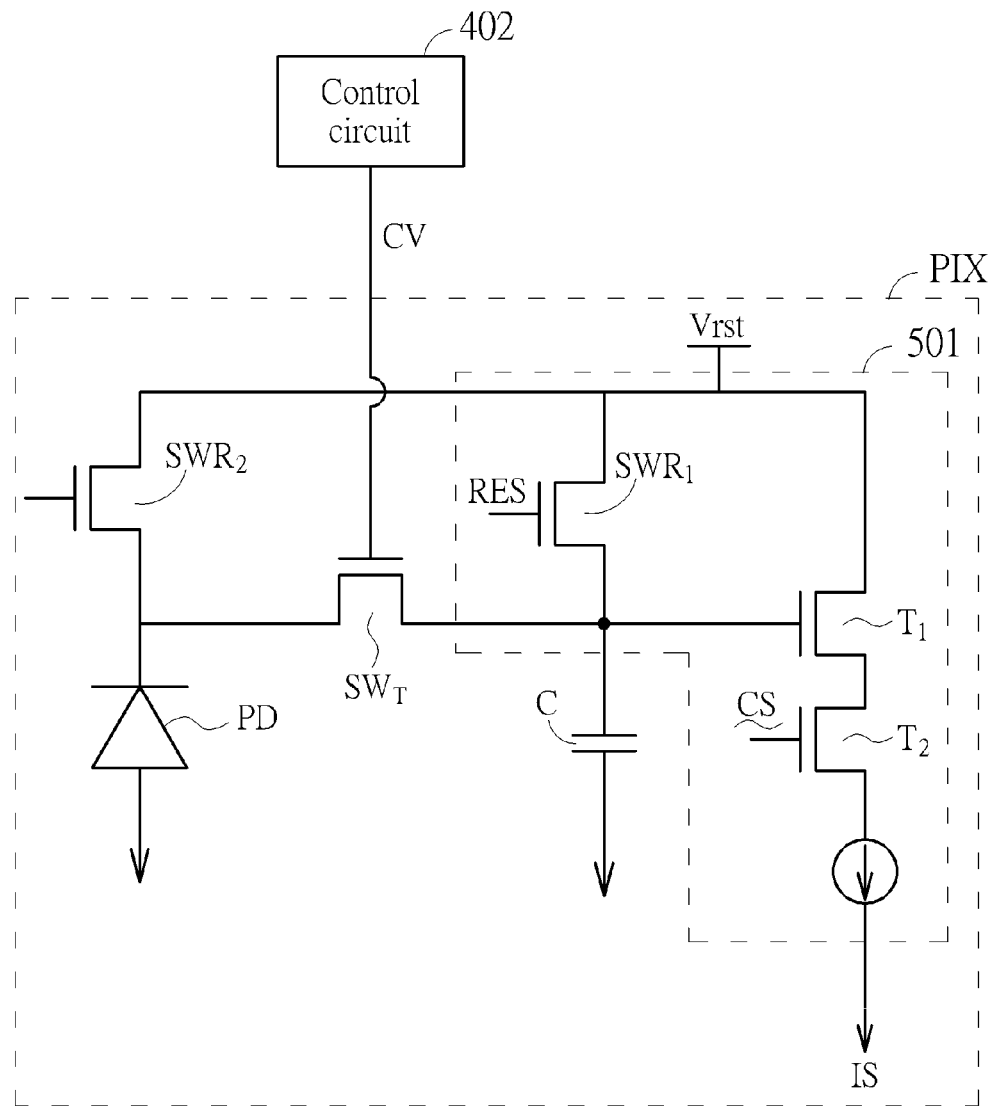

FIG. 4 and FIG. 5 are circuit diagrams illustrating an image sensing apparatus according to one embodiment of the present invention. Please note the structures in FIG. 4 and FIG. 5 are only for examples but do not mean to limit the scope of the present invention. As shown in FIG. 4, the image sensing apparatus 400 comprises an image sensing matrix 401, a control circuit 402, a signal reading circuit 403, an amplifier 405 and an analog to digital converter 407. The image sensing matrix 401 comprises at least one sensing pixel $PIX_{11}$-$PIX_{nm}$. The sensing pixels $PIX_{11}$-$PIX_{nm}$ generate at least one image sensing signals $IS_{11}$-$IS_{nm}$ according to a sensed image. The signal reading circuit 403 reads the image sensing signals $IS_{11}$-$IS_{nm}$. The amplifier 405 amplifies the image sensing signals $IS_{11}$-$IS_{nm}$ according to at least one amplifying parameter to generate amplified image sensing signals $AIS_{11}$-$AIS_{nm}$. The analog to digital converter 407 transforms the amplified image sensing signals $AIS_{11}$-$AIS_{nm}$ to digital amplified image sensing signals $DAIS_{11}$-$DAIS_{nm}$, which are applied for generating above-mentioned frames. Please note the amplifier 405 can be removed from the image sensing apparatus 400. In such case the analog to digital converter 407 directly digitalizes the image sensing signals $IS_{11}$-$IS_{nm}$, and the control circuit 402 generates a control voltage CV to at least one of the pixels $PIX_{11}$-$PIX_{nm}$.

FIG. 5 is a circuit diagram illustrating an image sensing apparatus according to one embodiment of the present invention. As shown in FIG. 5, the sensing pixel PIX comprises a charge storing device C, a light sensing device PD and a switch device $SW_T$. The control voltage CV generated by the control circuit 402 is transmitted to a control terminal of the switch device $SW_T$. The switch device $SW_T$ determines the charge amount for the photoelectrons can be transmitted to the charge storing device C. Additionally, the sensing pixel PIX can further comprise a reset device $SWR_2$, for resetting the light sensing device PD.

Figure 6:
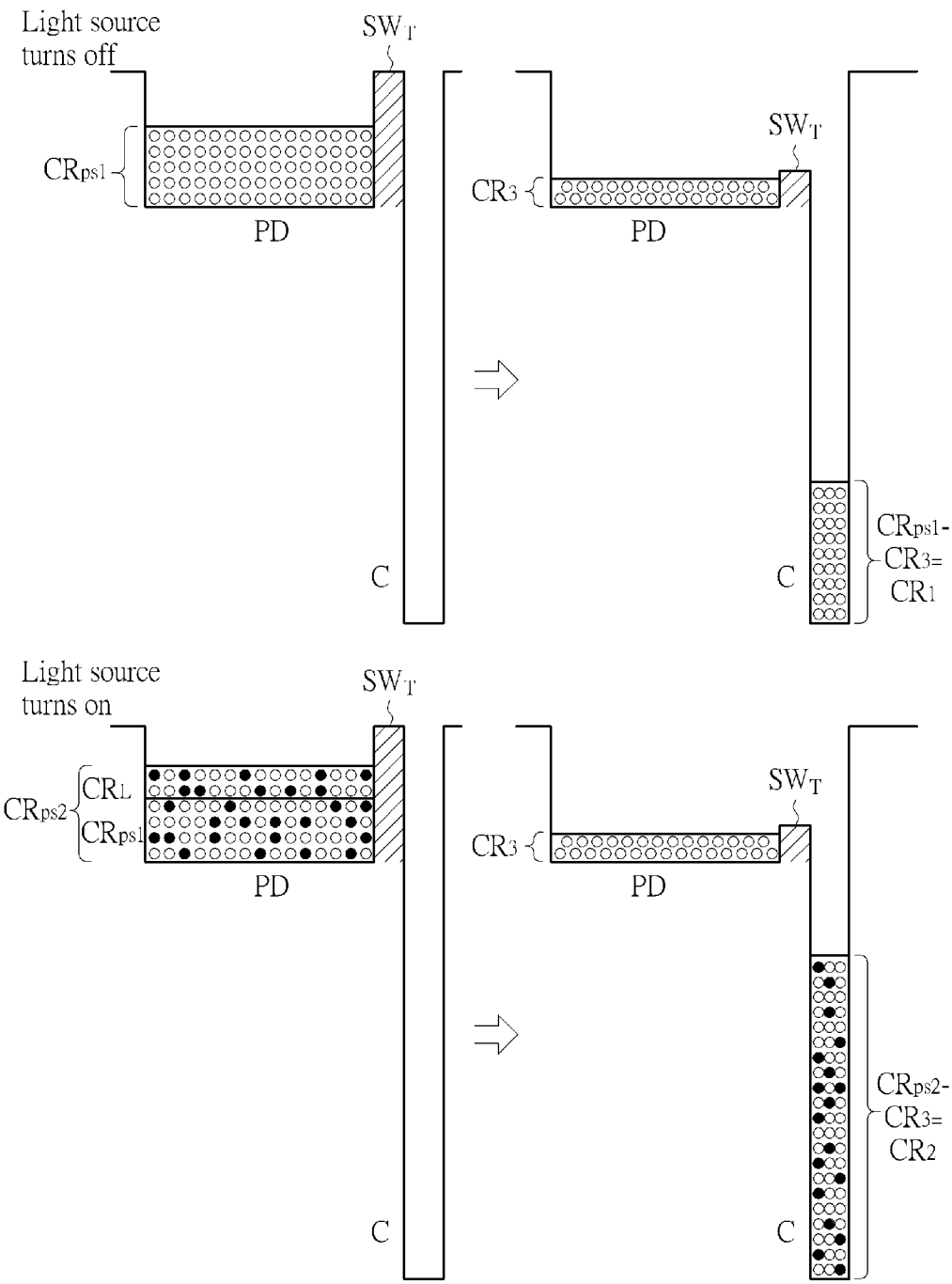
FIG. 6 is a schematic diagram illustrating the operation for the image sensing apparatus shown in FIG. 4.

FIG. 6 is a schematic diagram illustrating the operation for the image sensing apparatus shown in FIG. 4. As shown in FIG. 6, if the light source is turned off, the light sensing device PD generates a first amount $CR_{PS1}$ of photoelectrons according to environment light (white circles). The photoelectrons could not flow to the charge storing device C if the switch device $SW_T$ is not conductive. If the switch device $SW_T$ is controlled by the control voltage CV to be partially conductive, a third charge amount $CR_3$ of photoelectrons do not flow into the charge storing device C, thus the amount that the photoelectrons flow into the charge storing device C is $CR_{PS1}$-$CR_3$ (named a first charge amount $CR_1$ herein after). If the light source is turned on, the light sensing device PD generates a second amount $CR_{PS2}$ of photoelectrons according to environment light and light source light (black circles indicate the photoelectrons generated due to the light source light). The amount $CR_{PS2}$ of photoelectrons equals to the first amount $CR_{PS1}$ plus a photoelectron increasing amount $CR_L$. The photoelectrons could not flow into the charge storing device C if the switch device $SW_T$ is not conductive. If the switch device $SW_T$ is controlled by the control voltage CV to be partially conductive, a third charge amount $CR_3$ of photoelectrons sill could not flow into the charge storing device C, thus the amount that the photoelectrons flow into the charge storing device C is $CR_{PS2}$-$CR_3$ (named the second charge amount $CR_2$ herein after). After that, subtracting the image sensing signal generated by the first charge amount $CR_1$ of photoelectrons from the image sensing signal generated by the second charge amount $CR_2$ of the photoelectrons to acquire a frame generated only according to light source light. Please note although the charges with the third charge amount $CR_3$ below FIG. 6 are all indicated by white circles, it just mean the upper third charge amount $CR_3$ and the lower third charge amount $CR_3$ have the same values, but does not limit the charges that do not flow into the charge storing amount are the charges belonging to the first amount $CR_{PS1}$.

In the embodiment of FIG. 6, the first charge amount $CR_1$ and the second charge amount $CR_2$ are smaller than the maximum charge storing amount of the charge storing device C, thus the conventional over exposure issue will not occur do to too bright environment light. By this way, the charge storing device C needs no large capacity, such that the cost and the area for the charge storing device C are reduced. The SNR (signal noise ratio) can be raised by such method, even if the charge storing device C has enough capacity. For more detail, if the charge storing device C has enough capacity, for the prior art the charges can all flow into the charge storing device C, thus the ratio between photoelectrons according to light source light and all charges is $$\frac{CR_L}{CR_{RS2}}.$$

However, for the present application, ratio between photoelectrons according to light source light and all charges is $$\frac{CR_2 - CR_1}{CR_2} = \frac{(CR_{PS2} - CR_3) - (CR_{PS1} - CR_3)}{(CR_{PS2} - CR_3)} = \frac{CR_{PS2} - CR_{PS1}}{CR_{PS2} - CR_3} = \frac{CR_L}{CR_{PS2} - CR_3}.$$

Therefore, according to the method provided by the present invention, the image sensing signal corresponding to the photoelectrons generated from light of a light source occupies a larger portion of all image sensing signals, such the SNR for the image sensing signal can be increased.

Please back to FIG. 5, the sensing pixel PIX can further comprise an image sensing signal generating circuit 501, for generating an image sensing signal IS according to the photoelectrons stored in the charge storing capacitor C (i.e. one of the image sensing signals $IS_{11}$-$IS_{nm}$). In one embodiment, the image sensing signal generating circuit 501 comprises a reset device $SWR_1$, for resetting the charge storing device C. Additionally, the image sensing signal generating circuit 501 further comprises transistors $T_1$ and $T_2$. The reading units $SR_1$, $SR_2 \ldots SR_n$ in the signal reading circuit 403 all comprise a power storing device. If the control circuit 402 controls the transistor $T_2$ to be conductive via the control signal CS, the photoelectrons in the charge storing device C is transferred by the transistor $T_1$ to a voltage, and stored in the power storing device of the reading units $SR_1$, $SR_2 \ldots SR_n$. Persons skilled in the art can understand the detail operations for the image sensing signal generating circuit 501 in FIG. 5, thus are omitted for brevity here. Please note the image sensing signal generating circuit 501 in FIG. 5 is only for example and does not mean to limit the scope of the present invention.

Please refer to FIG. 4 again, the image sensing apparatus 400 according to the embodiment of the present invention can further comprise a feedback circuit 409, for providing feedback information according to a relation between the maximum charge storing amount and the first amount $CR_{PS1}$ or a relation between the maximum charge storing amount and the second amount $CR_{PS2}$, to control the control voltage. By this way, the third amount $CR_3$ in FIG. 6 can be adjusted to make sure the first charge amount $CR_1$ and the second charge amount $CR_2$ are not over the maximum charge storing amount of the charge storing device C, and make sure that the third charge amount is not too large to affect correct determining results. For example, if the first charge amount $CR_1$ generated in the period that the light source is turned off is already larger than the maximum charge storing amount for the capacitor C, it means the environment light is too bright such that the frame is still over-exposed even if the light source is already turned off. In such case, the control voltage should be adjusted to reduce the amount that the charges can flow the switch device SWT (ex. the third charge amount $CR_3$ is increased to control the switch not so conductive). By this way the first charge amount $CR_1$ is less than the maximum charge storing amount of the capacitor C to avoid over exposure. Accordingly, the control circuit 402 not only can adjust the control voltage according to information from the feedback circuit 409, but also can provide the control voltage according to the environment light information ELP provided by the environment sensing apparatus 411. The environment sensing apparatus 411 can detect the intensity for environment light and provide related information to the control circuit 402. Additionally, the control circuit 402 can receive a control command from outside to adjust the control voltage, that is, it can be set by a manufacturer or a user. However, please note the control circuit 402, the feedback circuit 409 and the environment light sensing apparatus 411 are not limited to be in the same apparatus with the image sensing matrix 401, these devices can also be provided in different apparatuses.

Please note the above-mentioned image sensing apparatus is not limited to be applied to an optical navigating apparatus with a light source illustrated above, but also can be applied to other apparatuses. The image sensing apparatuses according to an embodiment of the present invention can be summarized as follows: an image sensing apparatus comprising at least one sensing image and a control circuit. The sensing pixel comprises: a charge storing device; a light sensing device, for generating a first amount of photoelectrons according to received light in a first mode, and for generating a second amount of photoelectrons for according to received light in a second mode, wherein the second amount is larger than the first amount; and a switch device, for determining a charge amount that the photoelectrons can be transmitted from the light sensing device to the charge storing device according to a control voltage. The control circuit generates the control voltage, thereby the charge amount that the photoelectrons can be transmitted from the light sensing device to the charge storing device in the first mode is a first charge amount and the charge amount that the photoelectrons can be transmitted from the light sensing device to the charge storing device in the second mode is a second charge amount. The first charge amount equals to the first amount minus a third charge amount, and the second charge amount equals to the second amount minus the third charge amount.

Figure 7:
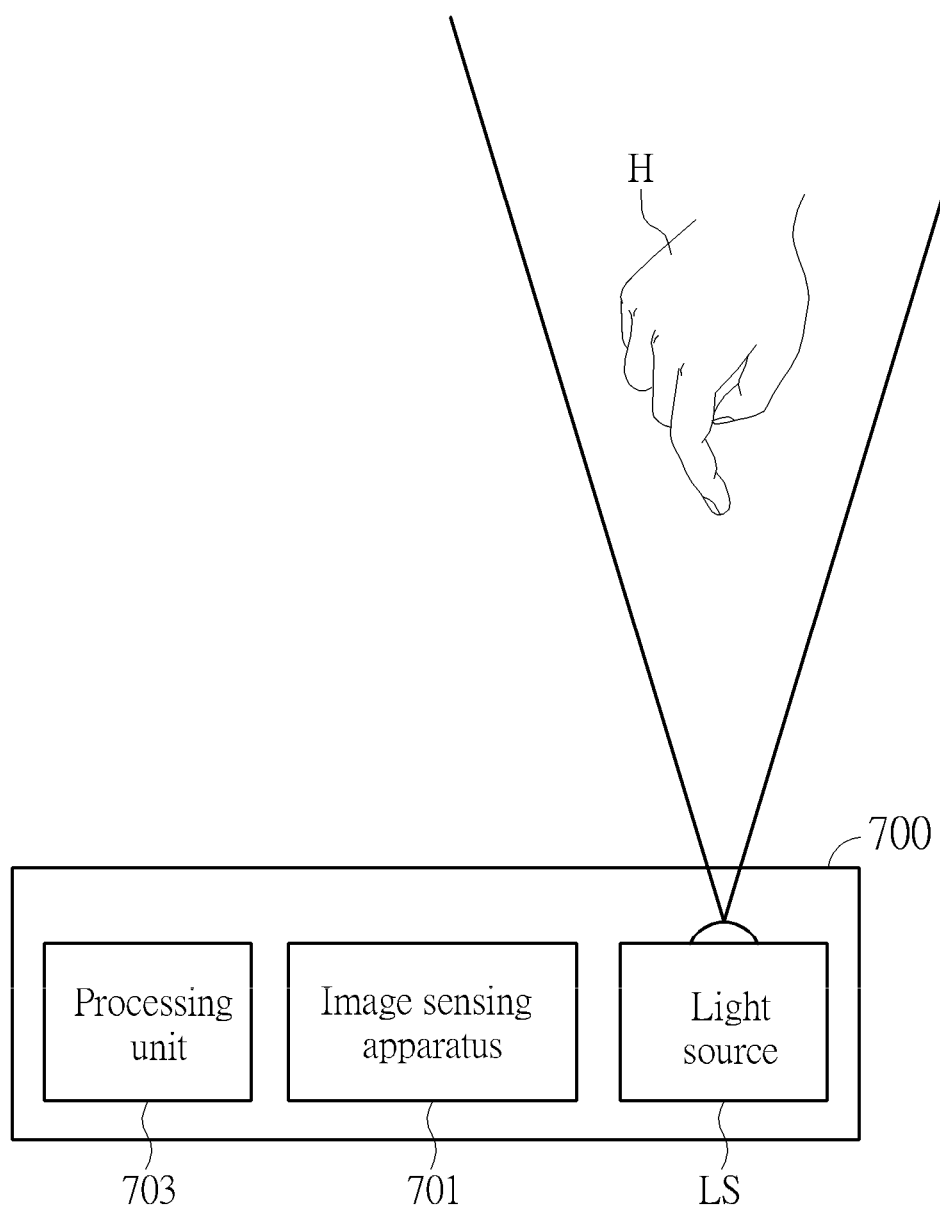
FIG. 7 and FIG. 8 are block diagrams illustrating an optical navigating apparatus according to embodiments of the present invention.
Figure 8:
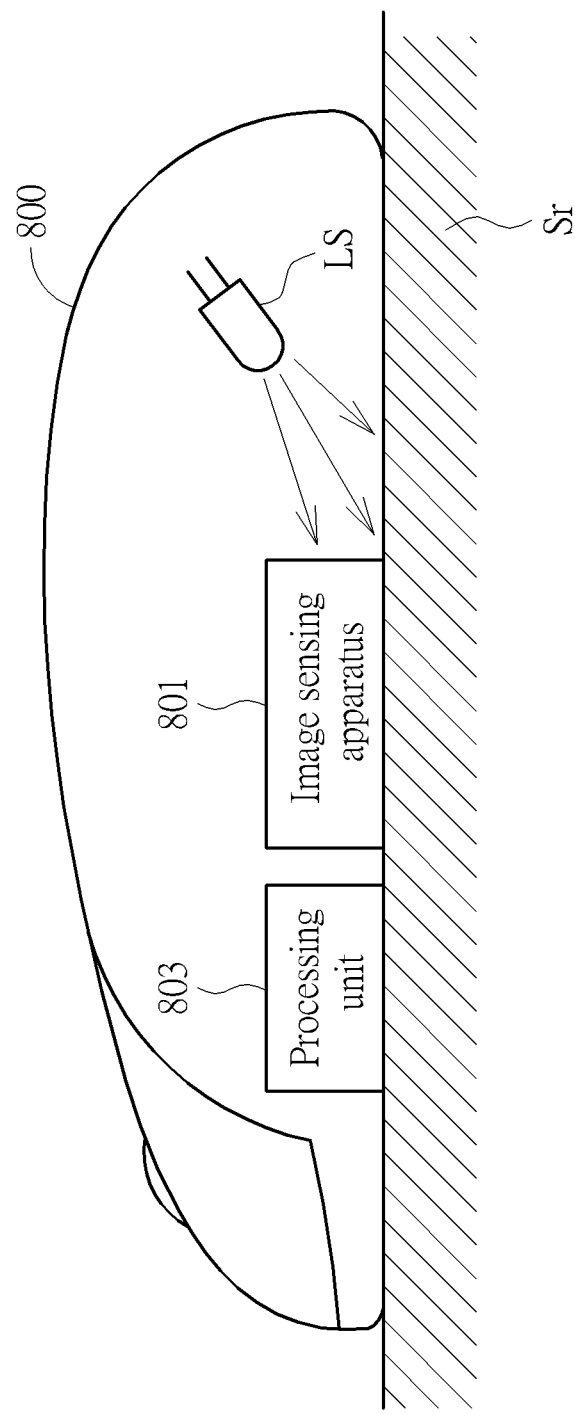

FIG. 7 and FIG. 8 are block diagrams illustrating an optical navigating apparatus according to embodiments of the present invention. As shown in FIG. 7, the optical navigating apparatus 700 comprises an image sensing apparatus 701, a processing unit 703 and a light source LS. The light source LS transmits the light to the object (a hand H in this embodiment) to generate a plurality of frames. The image sensing apparatus 601 captures a plurality of frames, and then the processing unit 703 computes a location for the hand H or a gesture according to the frames. The image sensing apparatus 701 comprises the sensing pixel structure in above-mentioned FIG. 5, and comprises a control circuit for acquiring frames with only light source light according to above-mentioned frame computing methods, such that the determining for the location of the hand H or the gesture can be more accurate. FIG. 8 illustrates an optical mouse 800, which is also one of the optical navigating devices. As shown in FIG. 8, the optical mouse comprises an image sensing apparatus 801, a processing unit 803 and a light source LS. The light source LS transmits the light to the object (in this embodiment, the surface Sr that the optical mouse is put on) to generate a plurality of frames. The image sensing apparatus 801 captures a plurality of frames, and the processing unit 803 generates the movement between the optical mouse 800 and the surface Sr. The image sensing apparatus 801 comprises the sensing pixel structure in FIG. 5, and utilizes a control circuit to acquire frames with only light source light based on above-mentioned frame computing method, such that the computing for the movement between the optical mouse 800 and the surface Sr can be more accurate. The control circuit can be integrated to processing units 703, 803 or be independent from the processing units 703, 803. Additionally, the optical navigating apparatus 700 and the optical mouse 800 can also comprise the feedback circuit 409 and the environment sensing apparatus 411 shown in FIG. 4.

Please note the image sensing apparatus provided by the present invention can be applied to other kinds of optical navigating apparatuses, and is not limited to be applied to the optical navigating apparatus shown in FIG. 7 and FIG. 8. Accordingly, the optical navigating apparatus with an image sensing apparatus provided by the present invention can be summarized as follows: an optical navigating apparatus, comprising an image sensing apparatus, a light source and a processing unit. The image sensing apparatus generates a first image sensing signal in a first mode, and generates a second image sensing signal in a second mode, and comprises a sensing pixel and a control circuit. The sensing pixel, comprises: a charge storing device; a light sensing device, for generating a first amount of photoelectrons according to received light in a first mode, and for generating a second amount of photoelectrons according to received light in a second mode, wherein the second amount is larger than the first amount; and a switch device, for determining a charge amount that the photoelectrons can be transmitted from the light sensing device to the charge storing device according to a control voltage; and an image sensing signal generating circuit, for generating an image sensing signal according to the charges stored in the charge storing device. The control circuit generates the control voltage, thereby the charge amount that the photoelectrons can be transmitted from the light sensing device to the charge storing device in the first mode is a first charge amount and the charge amount that the photoelectrons can be transmitted from the light sensing device to the charge storing device in the second mode is a second charge amount. The first charge amount equals to the first amount minus a third charge amount, and the second charge amount equals to the second amount minus the third charge amount. The first charge amount and the second charge amount are smaller than a maximum charge storing amount for the charge storing device. The image sensing signal generating circuit generates the first image sensing signal according to the first amount of photoelectrons, and generates the second image sensing signal according to the second amount of photoelectrons. The light source generates no light in the first mode, and provides light to the light sensing device in the second mode. The processing unit subtracts the first image sensing signal from the second image sensing signal to compute movement between the optical navigating apparatus and an object. The control circuit can be integrated to the processing unit.

In view of above-mentioned embodiments, the over-exposure issue due to too bright environment light for prior art can be avoided. Additionally, the feedback mechanism and the mechanism for setting the control voltage can control the conductive level for the sensing pixel to be optimized.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An image sensing apparatus, comprising:
   at least one sensing pixel, comprising: a charge storing device;
   a light sensing device, for generating a first amount of photoelectrons according to a environmental light received in a first mode, and for generating a second amount of photoelectrons according to the environmental light and a light source light received in a second mode, wherein the second amount is larger than the first amount; and
   a switch device, for determining a charge amount that the photoelectrons can be transmitted from the light sensing device to the charge storing device according to a control voltage and the switch device controlled by the control voltage to be partially conductive so a third charge amount of photoelectrons do not flow into the charge storing device; and
   a control circuit, for generating the control voltage, thereby the charge amount that the photoelectrons can be transmitted from the light sensing device to the charge storing device in the first mode is a first charge amount and the charge amount that the photoelectrons can be transmitted from the light sensing device to the charge storing device in the second mode is a second charge amount, wherein the first charge amount equals to the first amount minus the third charge amount, and the second charge amount equals to the second amount minus the third charge amount;
   wherein the first charge amount and the second charge amount are smaller than a maximum charge storing amount for the charge storing device.

2. The image sensing apparatus of claim 1, wherein the maximum charge storing amount for the charge storing device is larger than the second amount.

3. The image sensing apparatus of claim 1, wherein the sensing pixel further comprises an image sensing signal generating circuit, for generating an image sensing signal according to the photoelectrons stored in the charge storing device.

4. The image sensing apparatus of claim 1, further comprising a feedback circuit, for providing feedback information according to a relation between the maximum charge storing amount and the first amount or a relation between the maximum charge storing amount and the second amount, to control the control voltage.

5. The image sensing apparatus of claim 1, further comprising an environment light sensing apparatus, for sensing environment light to generate an environment light parameter, wherein the control circuit adjusts the control voltage according to the environment light parameter.

6. The image sensing apparatus of claim 1, wherein the control circuit receives an outer control command to generate the control voltage.

7. The image sensing apparatus of claim 1, further comprising a reset device, coupled to the light sensing device, for resetting the light sensing device according to a resetting signal.

8. An optical navigating apparatus, comprising:
   an image sensing apparatus, for generating a first image sensing signal in a first mode, and for generating a second image sensing signal in a second mode, comprising:
   a sensing pixel, comprising: a charge storing device;
   a light sensing device, for generating a first amount of photoelectrons according to a environmental light received in a first mode, and for generating a second amount of photoelectrons according the environmental light and a light source light to received in a second mode, wherein the second amount is larger than the first amount; and
   a switch device, for determining a charge amount that the photoelectrons can be transmitted from the light sensing device to the charge storing device according to a control voltage and the switch device controlled by the control voltage to be partially conductive so a third charge amount of photoelectrons do not flow into the charge storing device; and an image sensing signal generating circuit, for generating an image sensing signal according to the charges stored in the charge storing device; and a control circuit, for generating the control voltage, thereby the charge amount that the photoelectrons can be transmitted from the light sensing device to the charge storing device in the first mode is a first charge amount and the charge amount that the photoelectrons can be transmitted from the light sensing device to the charge storing device in the second mode is a second charge amount, wherein the first charge amount equals to the first amount minus the third charge amount, and the second charge amount equals to the second amount minus the third charge amount; wherein the first charge amount and the second charge amount are smaller than a maximum charge storing amount for the charge storing device;

wherein the image sensing signal generating circuit generates the first image sensing signal according to the first amount of photoelectrons, and generates the second image sensing signal according to the second amount of photoelectrons; and a light source, for generating no light in the first mode, and for providing light to the light sensing device in the second mode; a processing unit, for subtracting the first image sensing signal from the second image sensing signal to compute movement between the optical navigating apparatus and an object.

9. The optical navigating apparatus of claim 8, wherein the maximum charge storing amount for the charge storing device is larger than the second amount.

10. The optical navigating apparatus of claim 8, further comprising a feedback circuit, for providing feedback information according to a relation between the maximum charge storing amount and the first amount or a relation between the maximum charge storing amount and the second amount, to control the control voltage.

11. The optical navigating apparatus of claim 8, further comprising an environment light sensing apparatus, for sensing environment light to generate an environment light parameter, wherein the control circuit adjusts the control voltage according to the environment light parameter.

12. The optical navigating apparatus of claim 8, wherein the control circuit receives an outer control command to generate the control voltage.

13. The optical navigating apparatus of claim 8, further comprising a reset device, coupled to the light sensing device, for resetting the light sensing device according to a resetting signal.

14. The optical navigating apparatus of claim 8, wherein the control circuit is integrated to the processing unit.

* * * * *